United States Patent

Einthoven et al.

[15] 3,664,894

[45] May 23, 1972

[54] METHOD OF MANUFACTURING SEMICONDUCTOR DEVICES HAVING HIGH PLANAR JUNCTION BREAKDOWN VOLTAGE

[72] Inventors: Willem Gerard Einthoven, Belle Meade, N.J.; Howard Kenneth Donnell, Holicong, Pa.

[73] Assignee: RCA Corporation

[22] Filed: Feb. 24, 1970

[21] Appl. No.: 13,605

[52] U.S. Cl. ..............................148/186, 148/187, 148/188

[51] Int. Cl. ..............................H01l 7/44

[58] Field of Search ..............................148/186, 187, 188

[56] References Cited

UNITED STATES PATENTS

| | | | |
|---|---|---|---|
| 3,289,267 | 12/1966 | Ullrich | 148/186 |
| 3,311,963 | 4/1967 | Akira Abe | 148/186 |
| 3,365,794 | 1/1968 | Botka | 148/187 |
| 3,440,114 | 4/1969 | Harper | 148/187 |
| 3,458,781 | 7/1969 | Simon | 148/187 |

*Primary Examiner*—Hyland Bizot
*Attorney*—Glenn H. Bruestle

[57] ABSTRACT

A body of semiconductor material having first and second opposed faces, and containing a region of N type conductivity and a region of P type conductivity separated by a P-N junction. The N type region contains a central portion extending inward from one face partially through the body toward the second face, and a peripheral portion extending completely through the body with its resistivity increasing toward the second face relative to the remainder of the N type region adjacent the P-N junction. The peripheral portion encloses the P type region and extends the P-N junction to the second face where it has the least chance for voltage breakdown.

4 Claims, 8 Drawing Figures

INVENTORS
WILLEM G. EINTHOVEN &
HOWARD K. DONNELL

BY Glenn H. Bennett
Attorney

METHOD OF MANUFACTURING SEMICONDUCTOR DEVICES HAVING HIGH PLANAR JUNCTION BREAKDOWN VOLTAGE

BACKGROUND OF THE INVENTION

This invention relates to improved semiconductor devices and to a diffusion method for fabricating semiconductor devices with improved electrical characteristics.

Heretofore, it has been common to fabricate a number of semiconductor devices from a single P type wafer. In many of the devices, an N type impurity is diffused into one entire face of the wafer, thereby forming a P-N junction adjacent to the face. This procedure is commonly used with power transistors where an N+ impurity is diffused into one face of a P type wafer to form the collector regions and make an N+/P junction with the base regions of the transistors. N+ impurity is also diffused into the opposite face of the wafer to form emitter regions. Afterwards, the wafer is scribed and broken to form the individual transistors. In these transistors, the N+ collector region extends across the entire bottom surface of the transistor, and the collector-base junction is exposed on the periphery of the individual transistor chip. By exposing the collector-base junction at the peripheral surface of the transistor, a number of problems are created. The scribing and breaking process results in a jagged and rough surface, in comparison to the major surfaces of the transistor, and causes a number of micro cracks to form on the surface and through the collector-base junction. As a result, the collector-base junction is prone to exhibit high reverse bias leakage, which affects electrical breakdown in such a way as to cause jittery electrical characteristics.

Some prior art power transistors have extended the collector-base junction to the "emitter" surface of the devices. This has been done by making an additional N+ diffusion on the "emitter" face of the wafer around the periphery of the devices. In particular, an N+ impurity is diffused through the periphery of the base region and into the N+ collector region below, thereby extending the N+/P collector-base junction to the "emitter" face of the wafer. However, this process has a number of serious deficiencies as illustrated and further discussed below.

DESCRIPTION OF THE PRIOR ART

Figure 1:
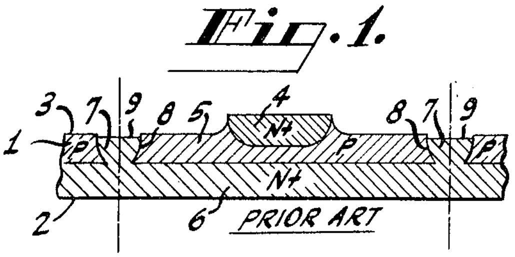
FIG. 1 is a cross-sectional view of a prior art transistor.

FIG. 1 is a cross-sectional view of a prior art transistor with its collector-base junction extended to the "emitter" face of the device. The transistor is being fabricated in a typical semiconductor wafer 1 of P type conductivity and has first and second faces 2 and 3, respectively. The transistor comprises an N+ emitter region 4, a P type base region 5 and an N+ collector region 6 and 7. As mentioned in the discussion of prior art transistors above, the peripheral portion 7 of the collector region is diffused from the second, or emitter, face 3 of the device through the periphery of the P type base region 5 and into the other portion of the collector region 6. Thus, the collector-base P-N junction 8 is extended to the emitter face 3 of the device. However, the transistor has a number of serious processing and resulting electrical deficiencies.

First, the peripheral portion 7 of the collector region is difficult to fabricate and requires a complicated set of masking and diffusing steps. The part of surface 3 of the base region 5, where the peripheral portion 7 is to be diffused through it, must first be etched to a substantial depth. This is because the N+ collector impurity must be diffused through the P type base region 5 and into the N+ collector region 6 without the N+ emitter region 4 also diffusing through the base region 5. Otherwise, the emitter 4 will be shorted to the collector 6. Thus, a peripheral moat 9 must be etched to a depth greater than the thickness of that portion of the base region 5 which is disposed between the emitter 4 and collector regions 6. In FIG. 1, the transistor is shown in a later state of fabrication where a substantial part of the base region 5, as well as the moat 9, is etched away to improve the electrical characteristic of the device. Additionally, the moat 9 etching steps and the subsequent N+ diffusion steps must be precisely aligned with one another so that the N+ diffusion is made exactly in the etched moat 9. If the diffusion mask and the moat 9 are not aligned, part of the N+ impurities will be deposited on the surface of the base region 5, and part of the moat 9 will be undercut when the mask is etched away. As a result, the peripheral portion 7 of the collector will have a distorted impurity gradient; and this in turn, will damage the electrical operation and breakdown characteristics of the device.

Second, by diffusing the N+ peripheral region 7 of the collector from the emitter face 3 of the wafer 1, the highest N+ dopant concentration of the collector region is at the emitter surface 3; and thus, the highest electrical field is at the surface of the junction 8. As a result, the collector-base electrical breakdown occurs at the surface of the junction 8 rather than across the desired parts of the collector-base junction parallel to the surfaces 2 and 3 of the wafer 1.

Third, the P-N junction 8 of the collector region makes an obtuse angle with the emitter surface 3; and this, in turn, increases the electric field at the junction 8 surface in comparison to a right angle or an acute angle. Thus, the increased electric field further reduces the breakdown voltage, and increases the likelihood that the breakdown will occur at the surface of the junction 8.

DESCRIPTION OF THE PREFERRED EMBODIMENTS

Figure 7:
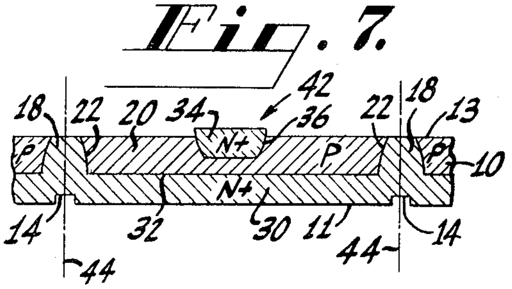

The present invention has particular utility in situations where a large number of semiconductor devices, such as transistors, are to be fabricated in a single semiconductor wafer and later diced into individual semiconductor devices; however, the invention is not limited to transistors, for it is also applicable to most other discrete and integrated devices. FIG. 7 is a cross-sectional view of a part of a typical semiconductor wafer 10 in a late stage of fabrication which includes a transistor 42 utilizing the present invention. The wafer 10 has two opposed faces 11 and 13 and is of P type conductivity. The transistor 42 includes an N+ emitter region 34, a P type base region 20, and an N+ collector region made of a central portion 30 and a peripheral portion 18. The central portion 30 extends inward from the first face 11 partially through the body toward the second face 13 and forms a P-N junction 32 with the base region 20. The peripheral portion 18 extends completely through the body with its resistivity increasing toward the face 13 relative to the remainder of the N type region adjacent the P-N junction 32. Additionally, the peripheral portion 18 encloses the base region 20 and is separated therefrom by a P-N junction 22 which extends the collector-base P-N junction 32 to the second face 13. Thus, the wafer 10 may be broken into individual transistors 42 through the peripheral portion 18 of the collector region along the axis 44 without damaging the collector-base P-N junction.

Figure 8:
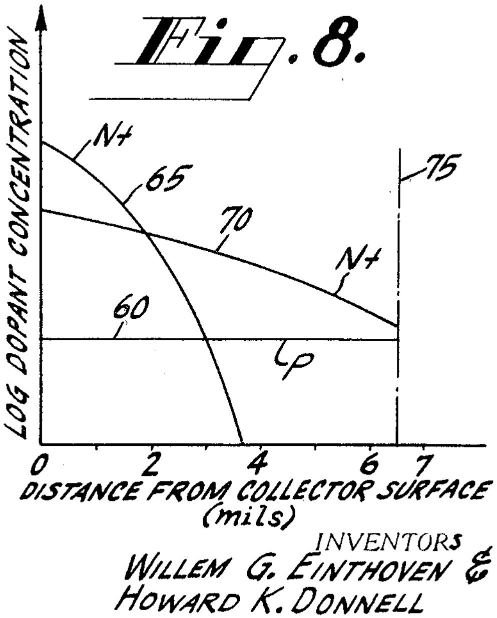
FIG. 8 is a graph which plots the collector and base dopant concentrations as a function of depth from the collector surface of a transistor of the present invention.

Also, the semiconductor devices of the present invention have additional improved electrical characteristics in comparison with prior art devices, as explained below. FIG. 8 is a graph which plots the collector and base dopant concentrations of the present transistor 42 (fabricated according to Example I below) as a function of the distance from the first face 11. The base region 20 has a constant dopant concentration of $1.4 \times 10^{15}$ atoms/cm$^3$, as shown by the curve 60; whereas, the dopant concentration of the collector region decreases with increasing distance from the first face 11. The central portion 30 has the highest surface concentration of about $10^{21}$ atoms/cm$^3$ and it decreases rapidly, curve 65, forming a P-N junction 32 with the base region 20 at a depth of about 3 mils. The peripheral portion 18 is diffused all the way through the wafer 10, curve 70, and has its lowest dopant concentration and highest resistivity at the second face 13 of the device, as shown by the line 75, where the dopant concentration is only slightly higher than that of the base region 20. In the present example, the peripheral dopant concentration decreases to as low as $2 \times 10^{15}$ atoms/cm$^3$. Thus, the part of the collector region adjacent the collector-base P-N junction has its lowest concentration gradients at the second face 13; and therefore, the P-N junction has its lowest electrical field and least chance for electrical breakdown at the exposed surface of the P-N junction 22. The collector-base junction has its highest concentration gradient across the major part of the P-N junction 32, where the voltage breakdown is most likely to occur and at a higher breakdown voltage than with prior art devices.

Additionally, as shown from FIG. 7, the peripheral portion 18 and the P-N junction 22 make an acute angle with the second face 13. The acute angle of the P-N junction 22 further reduces the electric field and the chance for electrical breakdown at the exposed surface of the P-N junction 22. Thus, the collector-base voltage breakdown is even less likely to occur across the peripheral portion of the P-N junction 22, and it further improves the breakdown voltage across the major part of the P-N junction 32 parallel to the faces 11 and 13 of the wafer 10.

Also the collector-base junction can be electrically tested while the devices are still in the wafer form. The collector-base junction of each device is now separate and independent of the remainder of the wafer and will not be affected by the other devices even if some of them are shorted or otherwise defective.

Further, devices of the present invention are easier to fabricate and have increased strength and production yields. The following example describes a preferred method for fabricating transistors in accordance with the present invention.

EXAMPLE I

Figure 2:
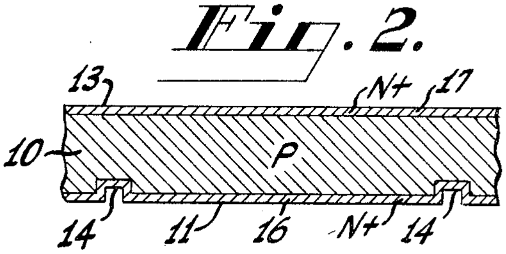

FIGS. 2–7 are cross-sectional views of a part of a typical semiconductor wafer 10 of a given type conductivity in various stages of fabrication. FIG. 2 shows part of a P type conductivity semiconductor wafer 10 about 7 mils thick and having opposed faces 11 and 13 in an early stage of fabrication. One face 11 of the wafer 10 is selectively etched to form a peripheral groove 14 which surrounds the base region 20 to be included in each of the devices to be fabricated. The grooves 14 are fabricated by first making a chromium mask of the same size and shape as the grooves 14 and placing the mask on the face 11 of the wafer 10. Apiezon wax is then painted over the mask and the wafer 10. The mask is then removed and the exposed parts of the wafer 10 are etched to the desired depth to form the grooves 14. In the present example, the grooves 14 are about 4 mils wide and 0.3 mils deep. The remainder of the wax is then removed with a solvent such as trichlorethylene.

The wafer 10 is then placed in a diffusion furnace to deposit the N+ impurity layers 16 and 17 on the faces 11 and 13 of the wafer 10. In the present example, the wafer 10 is heated at 1,215° C for 10 minutes in air; and then exposed to a source of $POCl_3$ for 30 minutes at 1,215° C; and finally, heated at 1,215° C in air for another 10 minutes. As a result, the faces 11 and 13 of the wafer 10 are coated with a layer of N+ impurities 16 and 17 to a thickness of about 0.3 mils.

Figure 3:
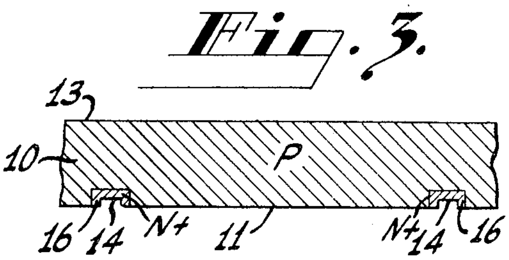

The wafer 10 is then removed from the furnace. The grooves are masked with apiezon wax and the wafer 10 is then placed in an etch bath for a period of time sufficient to remove the impurity layers 16 and 17 from the faces 11 and 13. Although the etchant is not particularly critical, a three part solution of hydrofluoric acid, nitric acid and acetic acid in the ratio of 1:1:1 is used as the etchant in the present example. After etching the wafer 10 for approximately 20 seconds, the N+ impurity layers 16 and 17 are removed from the faces 11 and 13 so that the layer 16 only remains in the peripheral grooves 14 as shown in FIG. 3. The apiezon wax is then removed from the grooves 14.

Figure 4:
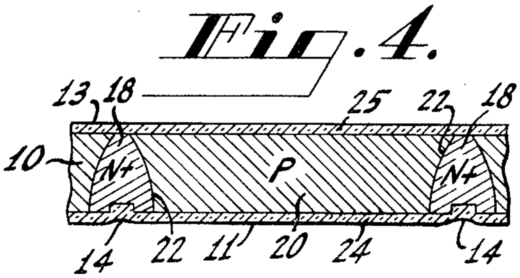

The wafer 10 is then placed in a diffusion furnace and heated to 1,100° C in steam for 150 minutes to oxidize both surfaces 11 and 13 of the wafer 10. As shown in FIG. 4, steam grown oxide layers 24 and 25 are thereby formed on the surfaces 11 and 13 of the wafer 10 to a thickness of about 10,000 A. The remaining N+ impurity layer 16 is then diffused by heating the wafer 10 to 1,300° C in air for 100 hours. As shown in FIG. 4, this forms the N+ peripheral regions 18 which have diffused entirely through the wafer 10. Thus, the wafer 10 is divided into P type regions 20 which are enclosed by the peripheral regions 18 and separated therefrom by the P-N junctions 22. The wafer 10 is then removed from the diffusion furnace and the oxide layers 24 and 25 are removed therefrom. This is generally done by dipping the wafer 10 in a hydrofluoric acid bath for about 10 seconds.

Figure 5:
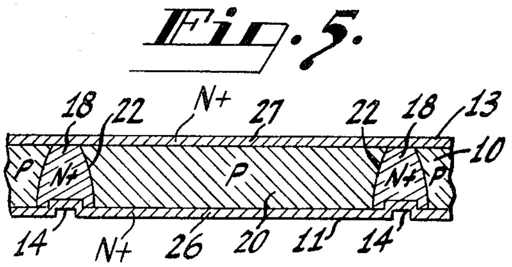
FIGS. 2–7 are cross-sectional views of a semiconductor device of the present invention in various stages of fabrication.

The wafer 10 is then inserted in a diffusion furnace and N+ impurity layers 26 and 27 are deposited upon the faces 11 and 13 of the wafer 10 as shown in FIG. 5. The N+ deposition is performed by heating the wafer 10 at 1,215° C for 10 minutes in air; then exposing it to a source of $POCl_3$ for 30 minutes at 1,215° C; and then heating it for another 10 minutes in air at 1,215° C.

Figure 6:
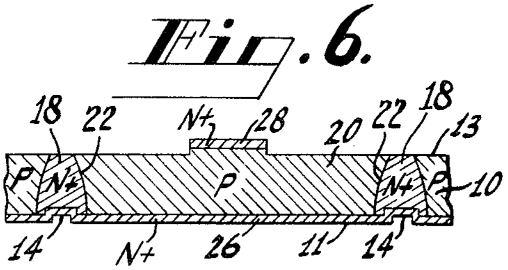

The wafer 10 is then removed from the diffusion furnace, and the impurity layer 27 on the second face 13 is selectively etched away to provide a central N+ impurity layer 28 as shown in FIG. 6. The etching step is performed by placing a chromium mask upon the second face 13 of the wafer 10 in proper position relative to the peripheral regions 18, and painting apiezon wax over both the mask and wafer 10. A negative mask of the impurity layer 28 is used so that when it is removed the selected portions of the second face 13 remain covered by the wax. The face 13 is then etched to remove the impurity layer 27 from the exposed portions of the face 13 to form the remaining N+ impurity layer 28.

The wax is then removed from the wafer 10, and the wafer 10 is placed in a diffusion furnace to simultaneously diffuse the impurity layers 26 and 28 into the wafer 10. The diffusion is performed by heating the wafer 10 to 1,300° in air for 20 hours to form the N+ regions 30 and 34. As shown in FIG. 7, the N+ region 30 forms the P-N junction 32 with the P type region 20 at a depth of about 3 mils from the first face 11 of the wafer 10. The N+ region 30 is continuous with the N+ region 18 and together form the collector region of an NPN transistor 42. The peripheral portion 18 of the collector region encloses the P type base region 20 and extends the collector-base P-N junction to the second wafer face 13. The N+ region 34 forms the emitter region of the transistor 42 and is disposed within the base region 20 and separated therefrom by a second P-N junction 36.

Metalization layers are then applied to all three regions 30, 20, and 34 of the transistor 42 by metalization methods well known in the prior art.

Finally, the wafer 10 is scribed and broken into individual transistors 42 which may be mounted and bonded as desired. In particular, the wafer 10 is scribed on the second face 13 in peripheral region 18 opposite the grooves 14, and then it is broken along the axis 44 through the grooves 14 as shown in FIG. 7.

EXAMPLE II

This example provides an alternate method of forming the N+ peripheral region 18. In this example, an N+ impurity layer 16 is selectively deposited upon the face 11 so that it is not necessary to form a plurality of grooves on the face 11 of the wafer 10. Typically, the layer 16 may be either deposited across the entire face 11 and selectively removed therefrom, or the wafer 10 may be selectively masked and the impurity layer 16 deposited through the openings therein. The impurity layer 16 is then diffused through the wafer 10 and the remainder of the processing steps are carried out as described in Example I. However, in comparing the two alternate methods, it is suggested that grooving the wafer 10, as described in Example I, is the optimum method. By grooving the wafer 10, the impurities are deposited deeper into the wafer and less diffusion time is required for the impurities to be diffused through the wafer 10. Additionally, the remainder of the wafer 10 is left at its original thickness to provide greater strength; and the grooves allow the wafer 10 to be broken more easily at the desired point along the desired axis. With the alternate embodiments, the wafer 10 is either reduced in thickness or requires a more complex set of masking and diffusing steps.

We claim:

1. A method of fabricating transistors from a wafer having first and second opposed faces; comprising the steps of:

a. diffusing an impurity of one type conductivity completely through selected portions of said wafer of opposite type conductivity from said first face to form a peripheral region of said one type conductivity in each of the transistors being fabricated;

b. diffusing an impurity of said one type conductivity partially through said wafer from said first face to form combined regions of said one type conductivity continuous with said peripheral regions, whereby each of the combined regions of said one type conductivity encloses a second region of the opposite type conductivity adjacent said second face and is separated therefrom by a P-N junction which extends to said second wafer face;

c. also diffusing an impurity of said one type conductivity into each of said second regions from said second face to form an additional region of said one type conductivity disposed within each of said second regions and separated therefrom by a second P-N junction; and d. dicing said wafer through said peripheral regions to divide said wafer into individual semiconductor devices.

2. A method of fabricating transistors as in claim 1 wherein the said second and third diffusion steps are performed simultaneously.

3. A method of fabricating transistors as in claim 1 also comprising the steps of first, selectively grooving said one face to form a peripheral groove surrounding each of said second regions; and then depositing an impurity of said second type conductivity in said peripheral grooves.

4. A method of fabricating transistors as in claim 3 wherein said dicing step comprises the steps of scribing said second face opposite said peripheral grooves; and breaking said wafer through said scribed and grooved peripheral regions.

* * * * *